(12) United States Patent
Gronbeck et al.

(10) Patent No.: US 7,018,678 B2
(45) Date of Patent: Mar. 28, 2006

(54) ELECTRONIC DEVICE MANUFACTURE

(75) Inventors: Dana A. Gronbeck, Holliston, MA (US); Michael K. Gallagher, Hopkinton, MA (US); Jeffrey M. Calvert, Acton, MA (US); Gregory P. Prokopowicz, Lancaster, MA (US); Timothy G. Adams, Sudbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 292 days.

(21) Appl. No.: 10/453,337

(22) Filed: Jun. 3, 2003

(65) Prior Publication Data

US 2004/0033700 A1    Feb. 19, 2004

Related U.S. Application Data

(60) Provisional application No. 60/385,369, filed on Jun. 3, 2002.

(51) Int. Cl.
*B05D 3/02* (2006.01)
(52) U.S. Cl. .................................................. 427/387
(58) Field of Classification Search ................ 427/387
See application file for complete search history.

(56) References Cited

U.S. PATENT DOCUMENTS

| | | | |
|---|---|---|---|
| 5,789,460 A | 8/1998 | Harkness et al. | |
| 5,883,219 A * | 3/1999 | Carter et al. | 528/310 |
| 5,891,529 A | 4/1999 | Harkness et al. | |
| 5,895,263 A | 4/1999 | Carter et al. | |
| 6,093,636 A * | 7/2000 | Carter et al. | 438/623 |
| 6,126,518 A | 10/2000 | Jacquinot et al. | |
| 6,177,360 B1 | 1/2001 | Carter et al. | |
| 6,225,238 B1 | 5/2001 | Wu | |
| 6,271,273 B1 | 8/2001 | You et al. | |
| 6,300,465 B1 | 10/2001 | Akiike et al. | |
| 6,303,192 B1 * | 10/2001 | Annapragada et al. | 427/527 |
| 6,329,280 B1 | 12/2001 | Cook et al. | |
| 6,348,736 B1 | 2/2002 | McGahay et al. | |
| 6,395,649 B1 | 5/2002 | Wu | |
| 6,420,441 B1 * | 7/2002 | Allen et al. | 521/77 |
| 6,576,681 B1 * | 6/2003 | Zampini et al. | 521/77 |
| 6,596,467 B1 * | 7/2003 | Gallagher et al. | 430/314 |
| 6,685,983 B1 * | 2/2004 | Hawker et al. | 427/96.2 |
| 2001/0008828 A1 | 7/2001 | Uchikura et al. | |
| 2001/0009936 A1 | 7/2001 | Suzuki et al. | |
| 2001/0012870 A1 | 8/2001 | Nishikawa et al. | |
| 2001/0051446 A1 | 12/2001 | Inoue et al. | |
| 2001/0051447 A1 | 12/2001 | Usami | |
| 2001/0055892 A1 | 12/2001 | Nishikawa et al. | |
| 2002/0020327 A1 | 2/2002 | Hayashi et al. | |

\* cited by examiner

*Primary Examiner*—Erma Cameron
(74) *Attorney, Agent, or Firm*—S. Matthew Cairns

(57) ABSTRACT

Methods for depositing uniform, pinhole-defect free organic polysilica coatings are provided. These methods allow for the use of these materials as spin-on cap layers in the manufacture of integrated circuits.

15 Claims, 3 Drawing Sheets

ELECTRONIC DEVICE MANUFACTURE

This application claims the benefit of provisional application Ser. No. 60/385,369, filed on Jun. 3, 2002.

BACKGROUND OF THE INVENTION

This invention relates generally to the field of manufacture of electronic devices. In particular, this invention relates to the manufacture of integrated circuit devices containing low dielectric constant material.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components.

A variety of organic and inorganic porous dielectric materials are known in the art in the manufacture of electronic devices, particularly integrated circuits. Suitable inorganic dielectric materials include silicon dioxide and organic polysilicas. Suitable organic dielectric materials include thermosets such as polyimides, polyarylene ethers, polyarylenes, polycyanurates, polybenzazoles, benzocyclobutenes, fluorinated materials such as poly(fluoroalkanes), and the like. Of the organic polysilica dielectrics, the alkyl silsesquioxanes such as methyl silsesquioxane are of increasing importance because of their low dielectric constant.

A method for reducing the dielectric constant of interlayer, or intermetal, insulating material is to incorporate within the insulating film very small, uniformly dispersed pores or voids. In general, such porous dielectric materials are prepared by first incorporating a removable porogen into a B-staged dielectric material, disposing the B-staged dielectric material containing the removable porogen onto a substrate, curing the B-staged dielectric material and then removing the porogen to form a porous dielectric material. For example, U.S. Pat. No. 5,895,263 (Carter et al.) and U.S. Pat. No. 6,271,273 (You et al.) disclose processes for forming integrated circuits containing porous organic polysilica dielectric material. In conventional processes, the dielectric material is typically cured under a non-oxidizing atmosphere, such as nitrogen, and optionally in the presence of an amine in the vapor phase to catalyze the curing process.

After the porous dielectric material is formed, it is subjected to conventional processing conditions of patterning, etching apertures, optionally applying a barrier layer and/or seed layer, metallizing or filling the apertures, planarizing the metallized layer, and then applying a cap layer or etch stop. These process steps may then be repeated to form another layer of the device.

A disadvantage of certain dielectric materials, including organic polysilica dielectric materials, is that they may not provide sufficient resistance to planarization techniques, such as chemical mechanical planarization ("CMP") used in subsequent manufacturing steps or sufficient resistance to etching, such as oxygen plasma, during photoresist removal from such dielectric materials. One solution to this is to use a layer of a different material atop the dielectric material (i.e. a cap layer) to provide the desired characteristics. Cap layers are useful in both single and dual damascene processes, particularly when porous dielectric materials are used. These layers planarize the surface of the dielectric by filling any surface defects, provide a denser matrix than that of the dielectric so as to seal any porosity having connectivity to the surface of the dielectric film (prevents intrusion of any residues from subsequent processing into the porous dielectric), improve the adhesion with subsequently applied layers of material and provide a hardmask having sufficient resistance to subsequent processing steps and etch differential between it and the underlying porous dielectric layer to allow sequential selective pattern transfers between successive layers of photoimaged pattern, cap layer and dielectric. Suitable cap layer compositions must be able to provide good coating uniformity in the required thickness range (e.g., 100 to 600 Å) and have a low dielectric constant ($k \leq 3.5$).

Although certain organic cap layers have recently been recommended, such as poly(arylene ethers), typical cap layers are based on silicon dioxide, silicon carbide, silicon nitride, silicon oxynitride and the like. For example, a conventional poly(arylene ether) dielectric material may have a non-porous methyl silsesquioxane capping layer, or alternatively, a conventional methyl silsesquioxane dielectric layer may have a non-porous poly(arylene ether) capping layer. U.S. patent application Ser. No. 2001/0051447 A1 (Usami) discloses a methyl silsesquioxane dielectric layer having a silicon oxide capping layer to improve the etch resistance.

Chemical vapor deposition ("CVD") methods are conventionally used to deposit cap layers on the underlying dielectric material. The carrier gas used in the CVD methods can generate amines, which in turn can lead to a poisoning of an overlaid photoresist layer, necessitating the use of either an $N_2O$ ashing step of the application of a barrier material between the cap layer and the photoresist. This problem can be eliminated by a spin-on process for the cap layer material. Spin-on methods for depositing cap layers are not without drawbacks. The major problem is assuring a uniform, defect-free coating of the cap layer material, particularly when an inorganic or organic-inorganic material is used as the cap layer. Organic polysilica materials, such as methyl silsesquioxane, often suffer from poor coating uniformity, pinhole defects, and crack formation during curing.

Thus, there is a need for methods for depositing cap layers, particularly organic polysilica cap layers, on a dielectric material that overcome the above problems.

SUMMARY OF THE INVENTION

It has been surprisingly found that cap layers containing organic polysilica material, such as alkyl and/or aryl silsesquioxane, can be prepared easily deposited on a dielectric material by spin-coating. Uniform and pinhole defect-free coatings of such cap layers have been achieved according to the present invention.

The present invention provides a method for depositing an organic polysilica cap layer on a dielectric material including the steps of: a) disposing a cap layer composition on a dielectric material, the cap layer composition including one or more B-staged organic polysilica resins and one or more coating enhancers; and b) at least partially curing the one or more B-staged organic polysilica resins to form a cap layer; wherein the one or more coating enhancers are present in an amount sufficient to provide a pinhole-free cap layer. The coating enhancers may then be removed prior to or during the step of completely curing the organic polysilica cap layer resin.

In another aspect, the present invention provides a method for manufacturing a device including the steps of: a) providing a dielectric material; b) disposing a cap layer composition on a dielectric material, the cap layer composition including one or more B-staged organic polysilica resins and one or more coating enhancers; and b) at least partially curing the one or more B-staged organic polysilica resins to form a cap layer; wherein the one or more coating enhancers are present in an amount sufficient to provide a pinhole-free cap layer.

In a further aspect, the present invention provides a method for manufacturing a device including the steps of: a) providing a dielectric material; b) disposing a cap layer composition on a dielectric material, the cap layer composition including one or more B-staged organic polysilica resins and removable porogen; and b) at least partially curing the one or more B-staged organic polysilica resin to form a cap layer; wherein the removable porogen is present in an amount sufficient to provide a pinhole-free cap layer.

In yet another aspect, the present invention provides a structure including a first layer of an organic polysilica dielectric material and a second layer disposed on the first layer, wherein the second layer is a composition including one or more B-staged organic polysilica resins and removable porogen, wherein the porogen is present in an amount sufficient to provide a pinhole-free second layer. Also included are structures wherein the second layer is at least partially cured.

Also provided by this invention is a structure including a porous first layer of an organic polysilica dielectric material and a porous cap layer disposed on the dielectric material. Preferably, the cap layer includes an organic polysilica material.

Further, this invention provides a structure including a layer of a dielectric material and porous cap layer disposed on the dielectric material.

Structures including a porous first layer of an organic polysilica dielectric material having a first etch selectivity and a porous cap layer disposed on the dielectric material having a second etch selectivity, wherein the difference in etch selectivities is 10% or greater are also provided.

In a still further aspect, this invention provides a structure including a dielectric layer having a dielectric constant of ≦3 and an organic polysilica cap layer disposed on the dielectric layer, wherein the organic polysilica cap layer has a dielectric constant of ≦2.9.

DETAILED DESCRIPTION OF THE INVENTION

Figure 1:
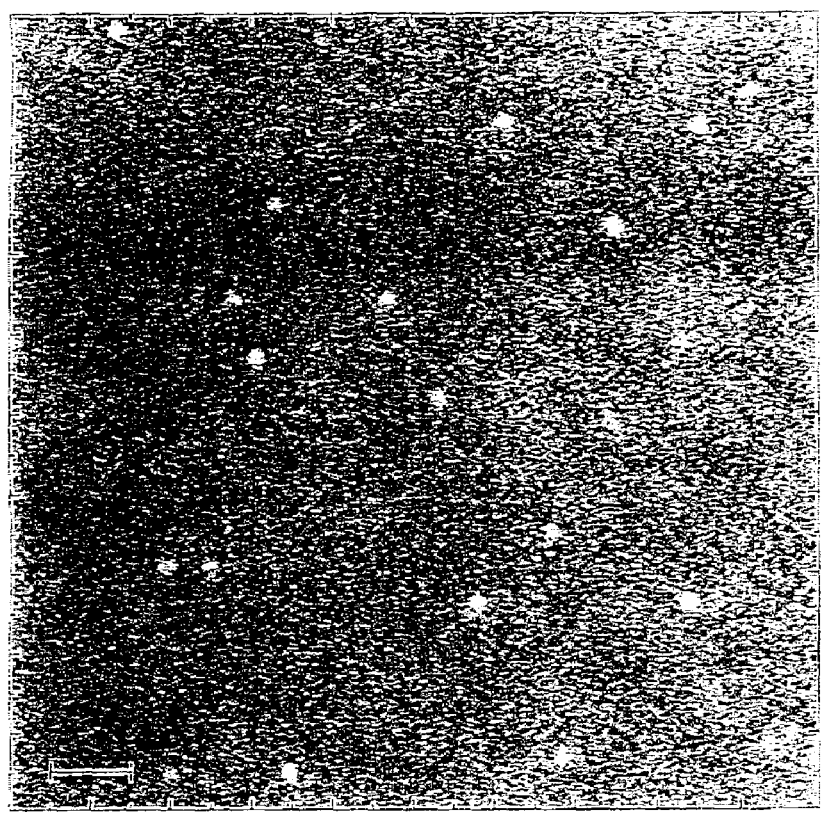
FIG. 1 is a scanning electron micrograph ("SEM") of a spin-coated organic polysilica cap layer having pinhole defects.

As used throughout this specification, the following abbreviations shall have the following meanings, unless the context clearly indicates otherwise: ° C.=degrees centigrade; UV=ultraviolet; nm=nanometer; g=gram; wt %=weight percent; L=liter; μm=micron=micrometer; rpm=revolutions per minute; N=normal; ca.=approximately; DI=deionized; and ppm=parts per million.

The term "alkyl" includes straight chain, branched and cyclic alkyl groups. The term "porogen" refers to a pore forming material, e.g. a polymeric material or particle dispersed in a material that is subsequently removed to yield pores in the material. Thus, the terms "removable porogen," "removable polymer" and "removable particle" are used interchangeably throughout this specification. "Porous" refers to a material that has been intentionally made porous, such as by the use of a porogen. As used herein, "dense" refers to material that has not been intentionally made porous. "Cross-linker" and "crosslinking agent" are used interchangeably throughout this specification. "Polymer" refers to polymers and oligomers, and also includes homopolymers and copolymers. The terms "oligomer" and "oligomeric" refer to dimers, trimers, tetramers and the like. "Monomer" refers to any ethylenically or acetylenically unsaturated compound capable of being polymerized or other compound capable of being polymerized by condensation. Such monomers may contain one or more double or triple bonds or groups capable of being polymerized by condensation.

The term "B-staged" refers to uncured organic polysilica materials. By "uncured" is meant any material that can be polymerized or cured to form higher molecular weight materials, such as coatings or films. As used herein, "partially cured" refers to a film or coating of organic polysilica resin or material that has been sufficiently cured so that only 1% or less of the thickness of the film is lost upon contact with a solvent suitable for dissolving the B-staged organic polysilica resin. Such partially cured films or coatings may undergo further curing during subsequent processing steps. "Films" and "Layers" are used interchangeably throughout this Specification. B-staged materials may be monomeric, oligomeric or mixtures thereof. B-staged material is further intended to include mixtures of polymeric material with monomers, oligomers or a mixture of monomers and oligomers.

Unless otherwise noted, all amounts are percent by weight and all ratios are by weight. All numerical ranges are inclusive and combinable in any order, except where it is clear that such numerical ranges are constrained to add up to 100%.

Organic polysilica cap layers can be deposited on a dielectric material including the steps of: a) disposing a cap layer composition on a dielectric material, the cap layer composition including one or more B-staged organic polysilica resins and one or more coating enhancers; and b) at least partially curing the one or more B-staged organic polysilica resins to form a cap layer; wherein the one or more coating enhancers are present in an amount sufficient to provide a pinhole-free cap layer. The term "cap layer" refers to any layer added to the top of a dielectric material and which performs one or more of the following functions: 1) fills any surface defects of the dielectric material; 2) provides a denser matrix than that of the dielectric so as to seal any porosity having connectivity to the surface of the dielectric film, which prevents intrusion of any residues from subsequent processing into the porous dielectric; 3) improves the adhesion of the dielectric layer with subsequently applied layers of material; and 4) provides a hardmask having sufficient resistance to subsequent processing steps and etch differential between it and the underlying porous dielectric layer to allow sequential selective pattern transfers between successive layers of photoimaged pattern, cap layer and dielectric. "Cap layers", as the term is generally used herein, include those layers functioning as etch stops, CMP stops, hardmasks and the like and are typically applied to a dielectric or insulating layer.

The present cap layer compositions include one or more B-staged organic polysilica resins and one or more coating enhancers. By "organic polysilica resin" (or organo siloxane) is meant a compound including silicon, carbon, oxygen and hydrogen atoms. Exemplary organic polysilica resins are hydrolyzates and partial condensates of one or more silanes of formulae (I) or (II):

$$R_aSiY_{4-a} \quad (I)$$

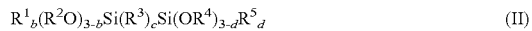

$$R^1{}_b(R^2O)_{3-b}Si(R^3)_cSi(OR^4)_{3-d}R^5{}_d \quad (II)$$

wherein R is hydrogen, $(C_1-C_8)$alkyl, $(C_7-C_{12})$arylalkyl, substituted $(C_7-C_{12})$arylalkyl, aryl, and substituted aryl; Y is any hydrolyzable group; a is an integer of 0 to 2; $R_1$, $R^2$, $R^4$ and $R^5$ are independently selected from hydrogen, $(C_1-C_6)$alkyl, $(C_7-C_{12})$arylalkyl, substituted $(C_7-C_{12})$arylalkyl, aryl, and substituted aryl; $R^3$ is selected from $(C_1-C_{10})$alkyl, $-(CH_2)_h-$, $-(CH_2)_{h1}-E_k-(CH_2)_{h2}-$, $-(CH_2)_h-Z$, arylene, substituted arylene, and arylene ether; E is selected from oxygen, $NR^6$ and Z; Z is selected from aryl and substituted aryl; $R^6$ is selected from hydrogen, $(C_1-C_6)$alkyl, aryl and substituted aryl; b and d are each an integer of 0 to 2; c is an integer of 0 to 6; and h, h1, h2 and k are independently an integer from 1 to 6; provided that at least one of R, $R^1$, $R^3$ and $R^5$ is not hydrogen. "Substituted arylalkyl", "substituted aryl" and "substituted arylene" refer to an arylalkyl, aryl or arylene group having one or more of its hydrogens replaced by another substituent group, such as cyano, hydroxy, mercapto, halo, $(C_1-C_6)$alkyl, $(C_1-C_6)$alkoxy, and the like.

It is preferred that R is $(C_1-C_4)$alkyl, benzyl, hydroxybenzyl, phenethyl or phenyl, and more preferably methyl, ethyl, iso-butyl, tert-butyl or phenyl. Preferably, a is 1. Suitable hydrolyzable groups for Y include, but are not limited to, halo, $(C_1-C_6)$alkoxy, acyloxy and the like. Preferred hydrolyzable groups are chloro and $(C_1-C_2)$alkoxy. Suitable organosilanes of formula (I) include, but are not limited to, methyl trimethoxysilane, methyl triethoxysilane, phenyl trimethoxysilane, phenyl triethoxysilane, tolyl trimethoxysilane, tolyl triethoxysilane, propyl tripropoxysilane, iso-propyl triethoxysilane, iso-propyl tripropoxysilane, ethyl trimethoxysilane, ethyl triethoxysilane, iso-butyl triethoxysilane, iso-butyl trimethoxysilane, tert-butyl triethoxysilane, tert-butyl trimethoxysilane, cyclohexyl trimethoxysilane, cyclohexyl triethoxysilane, benzyl trimethoxysilane, benzyl triethoxysilane, phenethyl trimethoxysilane, hydroxybenzyl trimethoxysilane, hydroxyphenylethyl trimethoxysilane and hydroxyphenylethyl triethoxysilane.

Organosilanes of formula (II) preferably include those wherein $R^1$ and $R^5$ are independently $(C_1-C_4)$alkyl, benzyl, hydroxybenzyl, phenethyl or phenyl. Preferably $R^1$ and $R^5$ are methyl, ethyl, tert-butyl, iso-butyl and phenyl. It is also preferred that b and d are independently 1 or 2. Preferably $R^3$ is $(C_1-C_{10})$alkyl, $-(CH_2)_h-$, arylene, arylene ether and $-(CH_2)_{h1}-E-(CH_2)_{h2}-$. Suitable compounds of formula (II) include, but are not limited to, those wherein $R^3$ is methylene, ethylene, propylene, butylene, hexylene, norbornylene, cyclohexylene, phenylene, phenylene ether, naphthylene and $-CH_2-C_6H_4-CH_2-$. It is further preferred that c is 1 to 4.

Suitable organosilanes of formula (II) include, but are not limited to, bis(hexamethoxysilyl)methane, bis(hexaethoxysilyl)methane, bis(hexaphenoxysilyl)methane, bis(dimethoxymethylsilyl)methane, bis(diethoxymethyl-silyl) methane, bis(dimethoxyphenylsilyl)methane, bis(diethoxyphenylsilyl)methane, bis(methoxydimethylsilyl) methane, bis(ethoxydimethylsilyl)methane, bis(methoxydiphenylsilyl)methane, bis(ethoxydiphenylsilyl)methane, bis(hexamethoxysilyl)ethane, bis(hexaethoxysilyl)ethane, bis(hexaphenoxysilyl)ethane, bis(dimethoxymethylsilyl) ethane, bis(diethoxymethylsilyl)ethane, bis(dimethoxyphenylsilyl)ethane, bis(diethoxyphenyl-silyl)ethane, bis(methoxydimethylsilyl)ethane, bis(ethoxydimethylsilyl)ethane, bis(methoxy-diphenylsilyl)ethane, bis(ethoxydiphenylsilyl) ethane, 1,3-bis(hexamethoxysilyl))propane, 1,3-bis(hexaethoxysilyl)propane, 1,3-bis(hexaphenoxysilyl)propane, 1,3-bis(dimethoxy-methylsilyl)propane, 1,3-bis(diethoxymethylsilyl)propane, 1,3-bis(dimethoxyphenyl-silyl)propane, 1,3-bis(diethoxyphenylsilyl)propane, 1,3-bis(methoxydimethylsilyl)propane, 1,3-bis(ethoxydimethylsilyl) propane, 1,3-bis(methoxydiphenylsilyl)propane, and 1,3-bis(ethoxydiphenylsilyl)propane. Preferred of these are hexamethoxydisilane, hexaethoxydisilane, hexaphenoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(hexamethoxysilyl)methane, bis(hexaethoxysilyl)methane, bis(dimethoxymethyl-silyl) methane, bis(diethoxymethyl)silyl)methane, bis(dimethoxyphenylsilyl)methane, bis(diethoxyphenylsilyl) methane, bis(methoxydimethylsilyl)methane, bis(ethoxydimethyl-silyl)methane, bis(methoxydiphenylsilyl) methane, and bis(ethoxydiphenylsilyl)methane.

When the B-staged organic polysilica resins include one or more of a hydrolyzate and partial condensate of organosilanes of formula (II), c may be 0, provided that at least one of $R^1$ and $R^5$ are not hydrogen. In an alternate embodiment, the B-staged organic polysilica resins may include one or more of a cohydrolyzate and partial cocondensate of organosilanes of both formulae (I) and (II). In such cohydrolyzates and partial cocondensates, c in formula (II) can be 0, provided that at least one of R, $R^1$ and $R^5$ is not hydrogen. Suitable silanes of formula (II) where c is 0 include, but are not limited to, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentamethoxy-2-phenyldisilane, 1,1,1,2,2-pentaethoxy-2-phenyldisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,1,2,2-tetraethoxy-1,2-diphenyldisilane, 1,1,2-trimethoxy-1,2,2-trimethyldisilane, 1,1,2-triethoxy-1,2,2-trimethyldisilane, 1,1,2-trimethoxy-1, 2,2-triphenyldisilane, 1,1,2-triethoxy-1,2,2-triphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

In one embodiment, particularly suitable B-staged organic polysilica resins are chosen from one or more of hydrolyzates and partial condensates of compounds of formula (I). Such B-staged organic polysilica resins have the formula (III):

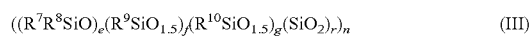

$$((R^7R^8SiO)_e(R^9SiO_{1.5})_f(R^{10}SiO_{1.5})_g(SiO_2)_r)_n \quad (III)$$

wherein $R^7$, $R^8$, $R^9$ and $R^{10}$ are independently selected from hydrogen, $(C_1-C_6)$alkyl, $(C_7-C_{12})$arylalkyl, substituted $(C_7-C_{12})$arylalkyl, aryl, and substituted aryl; e, g and r are independently a number from 0 to 1; f is a number from 0.2 to 1; n is integer from 3 to 10,000; provided that e+f+g+r=1; and provided that at least one of $R^7$, $R^8$ and $R^9$ is not hydrogen. In the above formula (III), e, f, g and r represent the mole ratios of each component. Such mole ratios can be varied between 0 and 1. It is preferred that e is from 0 to 0.8. It is also preferred that g is from 0 to 0.8. It is further preferred that r is from 0 to 0.8. In the above formula, n refers to the number of repeat units in the B-staged material. Preferably, n is an integer from 3 to 1000.

Suitable organic polysilica resins include, but are not limited to, silsesquioxanes, partially condensed halosilanes or alkoxysilanes such as partially condensed by controlled hydrolysis tetraethoxysilane having number average molecular weight of 500 to 20,000, organically modified silicates having the composition $RSiO_3$, $O_3SiRSiO_3$, $R_2SiO_2$ and $O_2SiR_3SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes such as methyl silsesquioxane, ethyl silsesquioxane, propyl silsesquioxane, butyl silsesquioxane and the like; aryl silsesquioxanes such as phenyl silsesquioxane and tolyl silsesquioxane; alkyl/aryl silsesquioxane mixtures such as a mixture of methyl silsesquioxane and phenyl silsesquioxane; and mixtures of alkyl silsesquioxanes such as methyl silsesquioxane and ethyl silsesquioxane. B-staged silsesquioxane materials include homopolymers of silsesquioxanes, copolymers of silsesquioxanes or mixtures thereof. Such materials are generally commercially available or may be prepared by known methods.

In an alternate embodiment, the organic polysilica resins may contain a wide variety of other monomers in addition to the silicon-containing monomers described above. For example, the organic polysilica resins may further comprise cross-linking agents, and carbosilane moieties. Such cross-linking agents may be any of the cross-linking agents described elsewhere in this specification, or any other known cross-linkers for silicon-containing materials. It will be appreciated by those skilled in the art that a combination of cross-linkers may be used. Carbosilane moieties refer to moieties having a $(Si-C)_x$ structure, such as $(Si-A)_x$ structures wherein A is a substituted or unsubstituted alkylene or arylene, such as $SiR_3CH_2-$, $-SiR_2CH_2-$, $=SiRCH_2-$, and $=SiCH_2-$, where R is usually hydrogen but may be any organic or inorganic radical. Suitable inorganic radicals include organosilicon, siloxyl, or silanyl moieties. These carbosilane moieties are typically connected "head-to-tail", i.e. having Si—C—Si bonds, in such a manner that a complex, branched structure results. Particularly useful carbosilane moieties are those having the repeat units ($SiH_xCH_2$) and ($SiH_{y-1}(CH=CH_2)CH_2$), where x=0 to 3 and y=1 to 3. These repeat units may be present in the organic polysilica resins in any number from 1 to 100,000, and preferably from 1 to 10,000. Suitable carbosilane precursors are those disclosed in U.S. Pat. No. 5,153,295 (Whitmarsh et al.) and U.S. Pat. No. 6,395,649 (Wu).

It is preferred that the B-staged organic polysilica resin includes a silsesquioxane, and more preferably methyl silsesquioxane, ethyl silsesquioxane, propyl silsesquioxane, iso-butyl silsesquioxane, tert-butyl silsesquioxane, phenyl silsesquioxane, tolyl silsesquioxane, benzyl silsesquioxane or mixtures thereof. Methyl silsesquioxane, phenyl silsesquioxane and mixtures thereof are particularly suitable. Other useful silsesquioxane mixtures include mixtures of hydrido silsesquioxanes with alkyl, aryl or alkyl/aryl silsesquioxanes. Typically, the silsesquioxanes useful in the present invention are used as oligomeric materials, generally having from 3 to 10,000 repeating units.

Particularly suitable organic polysilica B-staged resins are co-hydrolyzates and partial condensates of one or more organosilanes of formulae (I) and/or (II) and one or more tetrafunctional silanes having the formula $SiY_4$, where Y is any hydrolyzable group as defined above. Suitable hydrolyzable groups include, but are not limited to, halo, $(C_1-C_6)$ alkoxy, acyloxy and the like. Preferred hydrolyzable groups are chloro and $(C_1-C_2)$alkoxy. Suitable tetrafunctional silanes of the formula $SiY_4$ include, but are not limited to, tetramethoxysilane, tetraethoxysilane, tetrachlorosilane, and the like. Particularly suitable silane mixtures for preparing the cohydrolyzates and partial cocondensates include: methyl triethoxysilane and tetraethoxysilane; methyl trimethoxysilane and tetramethoxysilane; phenyl triethoxysilane and tetraethoxysilane; methyl triethoxysilane and phenyl triethoxysilane and tetraethoxysilane; ethyl triethoxysilane and tetramethoxysilane; and ethyl triethoxysilane and tetraethoxysilane. The ratio of such organosilanes to tetrafunctional silanes is typically from 99:1 to 1:99, preferably from 95:5 to 5:95, more preferably from 90:10 to 10:90, and still more preferably from 80:20 to 20:80.

In a particular embodiment, the B-staged organic polysilica resin is chosen from one or more of a co-hydrolyzate and partial co-condensate of one or more organosilanes of formula (I) and a tetrafunctional silane of formula $SiY_4$. In another embodiment, the B-staged organic polysilica resin is chosen from one or more of a co-hydrolyzate and partial co-condensate of one or more organosilanes of formula (II) and a tetrafunctional silane of formula $SiY_4$. In still another embodiment, the B-staged organic polysilica resin is chosen from one or more of a co-hydrolyzate and partial co-condensate of one or more organosilanes of formula (I), one or more silanes of formula (II) and a tetrafunctional silane of formula $SiY_4$. The B-staged organic polysilica resins include one or more of a non-hydrolyzed and non-condensed silane of one or more silanes of formulae (I) or (II) with one or more of the hydrolyzate and partial condensate of one or more silanes of formulae (I) of (II). In a further embodiment, the B-staged organic polysilica resin includes a silane of formula (II) and one or more of a hydrolyzate and partial condensate of one or more organosilanes of formula (I), and preferably one or more of a co-hydrolyzate and partial co-condensate of one or more organosilanes of formula (I) with a tetrafunctional silane of the formula $SiY_4$ where Y is as defined above. Perferably, such B-staged organic polysilica resin includes a mixture of one or more silanes of formula (II) and one or more of a co-hydrolyzate and partial co-condensate having the formula $(RSiO_{1.5})(SiO_2)$ where R is as defined above.

When organosilanes of formula (I) are co-hydrolyzed or co-condensed with a tetrafunctional silane, it is preferred that the organosilane of formula (I) has the formula $RSiY_3$, and preferably is selected from methyl trimethoxysilane, methyl triethoxysilane, ethyl trimethoxysilane, ethyl triethoxysilane, phenyl trimethoxysilane, phenyl triethoxysilane and mixtures thereof. It is also preferred that the tetrafunctional silane is selected from tetramethoxysilane and tetraethoxysilane.

In another embodiment, particularly useful cap layer compositions include one or more B-staged organic polysilica resins having the formula

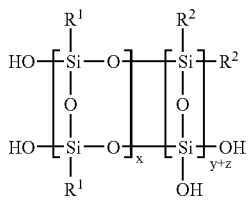

wherein each $R^1$ and $R^2$ are independently selected from hydroxyl, hydrogen, ($C_1$–$C_6$)alkyl, ($C_2$–$C_6$)alkenyl, and ($C_1$–$C_6$)alkylidine; x=0.3 to 0.7; and y+z=0.3 to 0.7; wherein x and y+z=the mole fraction of the components. When x+y+z does not equal 1, then it is understood that one or more other monomer units are included in the resin. Such other monomer units may be any which can co-condense with the monomer units of the above formula, and preferably are one or more of the above described silanes. In one embodiment, x+y+z=1. In another embodiment, $R^1$ and $R^2$ are independently selected from hydroxyl, hydrogen methyl, ethyl, vinyl, methylidine (—$CH_2$—) and ethylidine (—$CH_2CH_2$—). A particularly useful composition of this formula is where $R^1$ is methyl; $R_2$ is hydroxyl; x=0.5 to 0.6; and y+z=0.5 to 0.4. Such composition is prepared by the co-hydrolysis or co-condensation of methyl triethoxysilane and tetraethoxysilane. In general, resins having the above formula have a molecular weight of from 4000 to 100,000.

Any compound that provides an organic polysilica cap layer on a dielectric material wherein the cap layer is uniform and pinhole defect-free may be used as the present coating enhancers. As used herein, "pinhole" refers to a hole, such as from a few angstroms to 10 nm in diameter, that communicates through the cap layer from a top surface to a bottom surface and results from the deposition of the cap layer. Such pinholes are typically channels that are substantially circular in cross-section. The term "pinhole" does not include rips, tears or other mechanical defects and does not include intentionally formed pores such as by the use of a porogen.

In general, the coating enhancers are substantially non-aggregated or non-agglomerated in the B-staged material. Such non-aggregation or non-agglomeration reduces or avoids the problem of killer (very large) pore or channel formation in the cured or partially cured resin material, and is achieved by making the coating enhancer substantially compatible with the B-staged organic polysilica resin. By "substantially compatible" is meant that a composition of B-staged organic polysilica resin and coating enhancer is slightly cloudy or slightly opaque. Preferably, "substantially compatible" means at least one of a solution of the B-staged resin and coating enhancer, and a film or layer including a composition of B-staged resin and coating enhancer is slightly cloudy or slightly opaque. To be compatible, the coating enhancer must be soluble in or miscible in the B-staged resin, in the solvent used to dissolve the B-staged resin or both. Preferably, the coating enhancer must be soluble in or miscible in the B-staged organic polysilica resin.

The coating enhancers are preferably removable, meaning that they are sufficiently labile under certain conditions to be removed from the resulting cap layer. In one embodiment, the coating enhancers are removed and no pores are formed. In an alternate embodiment, the coating enhancers are removed to provide pores in the cap layer. As the purpose of a cap layer, inter alia, is to provide a sealing layer over a porous dielectric layer, and to act as a stop layer for certain processes such as CMP, the cap layer typically needs to be dense only until the purpose of the cap layer has been fulfilled. For example, when the cap layer is a CMP stop, it needs to remain dense until the surface of the device has been planarized. After such planarization, the cap layer may be made porous.

Exemplary coating enhancers include, without limitation, high boiling solvents, surfactants and removable polymers (porogens). "High boiling solvents" refers to solvents having a boiling point of ≧200° C. at atmospheric pressure, and preferably ≧250° C. Useful surfactants are any that contain poly(alkylene oxide) moieties or silicon-containing moieties. Preferred poly(alkylene oxide)-containing surfactants are ethylene oxide ("EO") or propylene oxide ("PO") polymers or copolymers of EO/PO. Exemplary poly(alkylene oxide) surfactants are polyethylene glycol and polypropylene glycol. Useful molecular weight ranges for the poly(alkylene oxide) surfactants are 100 to 50,000, preferably 200 to 20,000 and more preferably 250 to 5000. Particularly useful poly(alkylene oxide) surfactants are those sold under the PLURONIC and TETRONIC brands by BASF, Ludwigshafen, Germany. A wide variety of silicon-containing surfactants may be used, such as those sold under the SILWET brand.

A wide variety of removable polymers (porogens) may be used as the coating enhancers. The removable porogens may be polymers (linear, branched or particles) or may be co-polymerized with an organic polysilica dielectric monomer to form a block copolymer having a labile (removable) component. Such polymers are preferably compatible as described above. Suitable compatibilized porogens are those disclosed in U.S. Pat. No. 6,271,273 (You et al.) and European Patent Application EP Application No. 1 088 848 (Allen et al.). In one embodiment, the compatibilized porogen is a polymer that includes as polymerized units at least one compound selected from silyl-containing monomers and poly(alkylene oxide) monomers. The silyl containing monomers or poly(alkylene oxide) monomers may be used to form the uncrosslinked polymer, used as the crosslinker, or both. Other suitable removable particles are those disclosed in U.S. Pat. No. 5,700,844.

Any monomer containing silicon may be useful as the silyl-containing monomers. The silicon moiety in such silyl containing monomers may be reactive or unreactive. Exemplary "reactive" silyl containing monomers include those containing one or more alkoxy or acetoxy groups, such as, but not limited to, trimethoxysilyl containing monomers, triethoxysilyl containing monomers, methyl dimethoxysilyl containing monomers, and the like. Exemplary "unreactive" silyl containing monomers include those containing alkyl groups, aryl groups, alkenyl groups or mixtures thereof, such as but are not limited to, trimethylsilyl containing monomers, triethylsilyl containing monomers, phenyldimethylsilyl containing monomers, and the like. Polymeric porogens including silyl containing monomers as polymerized units are intended to include such porogens prepared by the polymerization of a monomer containing a silyl moiety. It is not intended to include a linear polymer that contains a silyl moiety only as end capping units.

Suitable silyl containing monomers include, but are not limited to, vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof.

The amount of silyl containing monomer useful to form the porogens of the present invention is typically from 1 to 99% wt, based on the total weight of the monomers used. It is preferred that the silyl containing monomers are present in an amount of from 1 to 80% wt, and more preferably from 5 to 75% wt.

Suitable poly(alkylene oxide) monomers include, but are not limited to, poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly(propylene glycol) phenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. Preferred poly(alkylene oxide) monomers include trimethoylolpropane ethoxylate tri(meth)acrylate, trimethoylolpropane propoxylate tri(meth)acrylate, poly(propylene glycol) methyl ether acrylate, and the like. Particularly suitable poly(propylene glycol) methyl ether acrylate monomers are those having a molecular weight in the range of from 200 to 2000. The poly(ethylene oxide/propylene oxide) monomers useful in the present invention may be linear, block or graft copolymers. Such monomers typically have a degree of polymerization of from 1 to 50, and preferably from 2 to 50.

Typically, the amount of poly(alkylene oxide) monomers useful in the porogens of the present invention is from 1 to 99% wt, based on the total weight of the monomers used. The amount of poly(alkylene oxide) monomers is preferably from 2 to 90% wt, and more preferably from 5 to 80% wt.

The silyl containing monomers and the poly(alkylene oxide) monomers may be used either alone or in combination to form the porogens of the present invention. In general, the amount of the silyl containing monomers or the poly(alkylene oxide) monomers needed to compatiblize the porogen with the dielectric matrix depends upon the level of porogen loading desired in the matrix, the particular composition of the organo polysilica dielectric matrix, and the composition of the porogen polymer. When a combination of silyl containing monomers and the poly(alkylene oxide) monomers is used, the amount of one monomer may be decreased as the amount of the other monomer is increased. Thus, as the amount of the silyl containing monomer is increased in the combination, the amount of the poly(alkylene oxide) monomer in the combination may be decreased.

The polymers suitable for use as porogens in the present invention are preferentially derived from one or more ethylenically or acetylenically unsaturated monomers including as polymerized units one or more compounds selected from silyl containing monomers and poly(alkylene oxide) monomers and more preferable include one or more cross-linking agents. Polymeric porogen particles contain one or more cross-linking agents. Suitable monomers which may be copolymerized with the one or more silyl containing monomers or one or more poly(alkylene oxide) monomers or mixtures thereof include, but are not limited to: (meth) acrylic acid, (meth)acrylamides, alkyl (meth)acrylates, alkenyl (meth)acrylates, aromatic (meth)acrylates, vinyl aromatic monomers, nitrogen-containing compounds and their thio-analogs, and substituted ethylene monomers.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate, methyl acrylate, ethyl acrylate, propyl methacrylate, butyl methacrylate, butyl acrylate, isobutyl methacrylate, hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate, 2-ethylhexyl methacrylate, octyl methacrylate, decyl methacrylate, isodecyl methacrylate, undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate, a mixture of linear and branched isomers of dodecyl, tridecyl, tetradecyl and pentadecyl methacrylates; and lauryl-myristyl methacrylate.

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate, which is a mixture of hexadecyl, octadecyl, cosyl and eicosyl methacrylate; and cetyl-stearyl methacrylate, which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers may optionally be substituted. Suitable optionally substituted (meth)acrylamide and alkyl (meth)acrylate monomers include, but are not limited to: hydroxy ($C_2$–$C_6$)alkyl (meth)

acrylates, dialkylamino($C_2$–$C_6$)-alkyl (meth)acrylates, dialkylamino($C_2$–$C_6$)alkyl (meth)acrylamides.

Substituted alkyl (meth)acrylate monomers include those with one or more hydroxyl groups in the alkyl radical, especially those where the hydroxyl group is found at the β-position (2-position) in the alkyl radical. Suitable hydroxyalkyl (meth)acrylate monomers include those in which the substituted alkyl group is a ($C_2$–$C_6$)alkyl, branched or unbranched. Exemplary hydroxyalkyl (meth) acrylate monomers include, but are not limited to: 2-hydroxyethyl methacrylate, 2-hydroxyethyl acrylate, 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof.

Other substituted (meth)acrylate and (meth)acrylamide monomers include those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethyl-aminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi ($C_1$–$C_6$) alkylsilyl (meth)acrylate, vinyl tri($C_1$–$C_6$)alkylsilyl (meth) acrylate, and mixtures thereof.

The vinylaromatic monomers useful as unsaturated monomers in the present invention include, but are not limited to: styrene, α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$)alkyl, carb ($C_1$–$C_{10}$)alkoxy, carboxy, amino, ($C_1$–$C_{10}$)alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrroli vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride and vinylidene bromide.

The polymers useful as porogens in the present invention may be prepared by a variety of polymerization techniques, such as solution polymerization or emulsion polymerization, and preferably by solution polymerization. It is preferred that the polymers of the present invention are prepared using anionic polymerization or free radical polymerization techniques. The solution polymers useful in the present invention may be linear, branched or grafted and may be copolymers or homopolymers. Particularly suitable solution polymers include cross-linked copolymers. Typically, the molecular weight of these polymers is in the range of 5,000 to 1,000,000. Exemplary molecular weight ranges are from 10,000 to 500,000, and from 10,000 to 100,000. The polydispersity of these materials is in the range of 1 to 20, preferably 1.001 to 15, and more preferably 1.001 to 10.

The solution polymers of the present invention are generally prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The solution polymers of the present invention may be prepared by a variety of methods, such as those disclosed in U.S. Pat. No. 5,863,996 (Graham) and European Patent Application EP 1 088 848 (Allen et al.). The emulsion polymers useful in the present invention are generally prepared the methods described in Allen et al.

The polymer particle porogens of the present invention include cross-linked polymer chains. Any amount of cross-linker is suitable for use in the present invention. Typically, the porogens of the present invention contain at least 1% by weight, based on the weight of the porogen, of cross-linker. Up to and including 100% cross-linking agent, based on the weight of the porogen, may be effectively used in the particles of the present invention. It is preferred that the amount of cross-linker is from 1% to 80%, and more preferably from 1% to 60%. It will be appreciated by those skilled in the art that as the amount of cross-linker in the porogen increases, the conditions for removal of the porogen from the dielectric matrix may change.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate, ethyleneglycol dimethacrylate, diethyleneglycol dimethacrylate, propyleneglycol dimethacrylate, propyleneglycol diacrylate, trimethylolpropane trimethacrylate, divinyl benzene, glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof. Silyl containing monomers that are capable of undergoing cross-linking may also be used as cross-linkers, such as, but not limited to, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), tetraallylsilane, 1,3-dimethyl tetravinyldisiloxane, 1,3-divinyl tetramethyldisiloxane and mixtures thereof.

Substantially compatibilized porogens, typically have a molecular weight in the range of 5,000 to 1,000,000, such as from 10,000 to 500,000, and more typically 10,000 to 100,000. The polydispersity of these materials is in the range of 1 to 20, preferably 1.001 to 15, and more preferably 1.001 to 10. Typically, the useful particle size range for the cross-linked polymeric porogen particles described above is up to 1,000 nm, such as that having a mean particle size in the range of 0.5 to 1000 nm. It is preferred that the mean particle size is in the range of 0.5 to 200 nm, more preferably from 0.5 to 50 nm, and most preferably from 1 nm to 20 nm.

Suitable block copolymers having labile components are those disclosed in U.S. Pat. Nos. 5,776,990 and 6,093,636. Such block copolymers may be prepared, for example, by using as pore forming material highly branched aliphatic esters that have functional groups that are further functionalized with appropriate reactive groups such that the functionalized aliphatic esters are incorporated into, i.e. copolymerized with, the vitrifying polymer matrix.

When the removable porogens are not components of a block copolymer, they may be combined with the B-staged organic polysilica resin by any methods known in the art. Typically, the B-staged material is first dissolved in a suitable solvent, such as methyl isobutyl ketone, diisobutyl ketone, 2-heptanone, γ-butyrolactone, γ-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof to form a solution. The porogens are then dispersed or dissolved within the solution. The resulting composition (e.g. dispersion, suspension or solution) is then deposited on a substrate by methods known in the art for depositing B-staged dielectric materials.

The coating enhancers are typically added to the B-staged organic polysilica resins in an amount sufficient to provide the desired uniformity and pinhole defect-free cap layers. For example, the coating enhancers may be added to the B-staged materials in any amount of from 1 to 90 wt %, based on the weight of the B-staged material, preferably from >3 wt %, more preferably ≧5 wt %, and even more preferably from ≧10 wt %. There is no real upper limit on the amount of coating enhancer that can be used. It is preferred to use the lowest amount of coating enhancer that provides the desired cap layer quality. For example, certain coating enhancers may raise the dielectric constant of the cap layer. As an overall low dielectric constant is desired for the device, it is preferred to the least amount of such coating enhancers required to provide the desired pinhole defect-free cap layer, to avoid unnecessarily increasing the overall dielectric constant of the dielectric layer-cap layer stack. Alternatively, it may be desired to use a coating enhancer such as a removable porogen which may provide a porous cap layer, thus reducing the dielectric constant of the cap layer as well as the overall dielectric constant of the dielectric layer-cap layer stack. When a compatibilized polymeric porogen is used as the coating enhancer, it is preferably used in an amount of >3 wt % to 25 wt %, more preferably 5 to 20 wt % and still more preferably 8 to 15 wt %.

The cap layer compositions may further include one or more organic solvents. A solvent is preferred. Any solvent that dissolves, disperses, suspends or otherwise is capable of delivering the B-staged organic polysilica resin and the coating enhancer to the substrate is suitable. Such organic solvents are well known in the art and include, but are not limited to, ketones such as methyl isobutyl ketone, diisobutyl ketone, cyclohexanone, and 2-heptanone, lactones such as γ-butyrolactone and γ-caprolactone, esters such as ethyl lactate, propyleneglycol monomethyl ether acetate, n-amyl acetate, n-butyl acetate, ethers such as diphenyl ether and anisole, glycol ethers such as propyleneglycol monomethyl ether, N-methyl-2-pyrrolidone, N,N'-dimethylpropyleneurea, aromatic hydrocarbons such as mesitylene, toluene, and xylenes, and mixtures of solvents. Alternatively, solvents may consist of highly pressurized gases, such as supercritical carbon dioxide, with one or more co-solvents or additives to provide the desired solvency properties. It is preferred that a composition including one or more B-staged organic polysilica materials and one or more organic solvents is disposed on a substrate. Once such a composition is disposed on the substrate, the solvent may be removed prior to or during the step of curing the B-staged organic polysilica material.

The cap layer compositions may further include one or more additional components, such as inorganic compounds. Suitable inorganic compounds include, but are not limited to silica, alumina, ceria, zirconia, silicon carbide, silicon nitride and the like, including mixtures thereof. Such inorganic particles may be very fine (ultrafine) powders, sols, colloids, or in any other suitable form. As an example, silica, alumina, and zirconia may be synthesized by a fumed method in which oxygen and hydrogen are reacted with silicon chloride, aluminum chloride or titanium chloride in a gas phase. A sol-gel method may be also be used. In this method, a metal alkoxide such as tetraethoxysilane or an aluminum alkoxide is hydrolyzed and condensation is performed. Colloidal silica is a dispersion of highly pure silicic anhydride in a hydrophilic organic solvent, such as with a solids content in the range of 10 to 40%, where the silica particles have an average diameter of 5 to 30 nm and preferably 10 to 20 nm. Colloidal silica, such as methanol silica sol or iso-propanol silica sol, and colloidal alumina are generally commercially available, such as from Nissan Chemical Industries, Ltd.

Alternatively, the inorganic compounds may be co-condensed or co-hydrolyzed with any of the above described silicon-containing monomers, oligomers or polymers. Metal alkoxides are typically used as the inorganic compounds for use in such co-condensations or co-hydrolyses. Cerium alkoxides, aluminum alkoxides and zirconium alkoxides are the most useful metal alkoxides for this application. Useful alkoxide moieties are ($C_1$–$C_6$)alkoxides and more particularly ($C_1$–$C_3$)alkoxides.

One or more stabilizing compounds for the B-staged organic polysilica resin may also be used in the cap layer compositions. Such stabilizing compounds typically stabilize the organic polysilica resin against premature condensation or polymerization. Suitable stabilizing compounds include, but are not limited to, organic acids having 2 carbons or more and having a pKa of 1 to 4, and organic acids capable of functioning as a chelating agent. The amount of such stabilizing compounds is in the range of 1 to 10,000 ppm and preferably 5 to 5000 ppm.

Other optional components that may be added to the present cap layer compositions include, but are not limited to, copper chelating agents, base curing agents, acid curing agents and the like. Any useful copper chelating agent may be used, such as hydroxylamine, hydroxylamine derivatives, benzotriazole, and the like. Base curing agents include, bases, thermal base generators and photobase generators. Complexes of bases with certain acids may also be suitable base curing agents. Such base curing agents are well known to those skilled in the art. Acid curing agents include thermal acid generators and photoacid generators. The useful acid curing agents are well-known to those skilled in the art. The amount of such optional base and acid curing agents present in the compositions is typically small, such as in catalytic quantities and are well within the abilities of those in the art.

The cap layer compositions are disposed on a dielectric substrate by any suitable means, such as, but not limited to, spin coating, spray coating or doctor blading. Spin coating is preferred. Such disposing means typically provide a film, layer or coating of B-staged material. The dielectric substrate may be partially cured or fully cured. The only concern being that the dielectric substrate is sufficiently cured to prevent intermixing with the cap layer composition.

Any dielectric material used in the manufacture of electronic devices, such as integrated circuits, may benefit from the cap layer of the present invention. Suitable dielectric materials include, but are not limited to organic polysilica materials, silicon dioxide, fluorinated silicon dioxide, benzocyclobutenes, poly(arylene ethers), poly(aryl esters), poly(ether ketones), polycarbonates, polyimides, fluorinated polyimides, polynorbornenes, polyaromatic hydrocarbons such as polynaphthalene, polyquinoxalines, poly(perfluorinated hydrocarbons) such as poly(tetrafluoroethylene), and polybenzoxazoles. Suitable organic polysilica dielectric materials are any having the compositions described above. Preferably, the dielectrics are porous. Porous organic polysilica dielectrics are well known and are disclosed in U.S. Pat. No. 6,271,273 (You et al.) and U.S. Pat. No. 5,895,263 (Carter et al.). In one embodiment, the dielectric material is a thermally degradable material, which can be subsequently selectively removed during further processing of an electronic device, i.e. after curing of any applied cap layer. Suitable thermally degradable polymers are those disclosed in U.S. Pat. No. 6,165,890 (Kohl et al.).

Once the cap layer composition is applied to the dielectric substrate, the solvent is removed such as by heating at a temperature of 90° to 150° C. for 10 to 120 seconds. The cap layer is then typically soft baked at a temperature of 150° to 250° for 10 to 360 seconds to at least partially cure the cap layer.

Sufficient cap layer composition is typically applied to the dielectric substrate to provide a cap layer having a desired thickness. Typical thicknesses range from 100 to 1000 Å and preferably from 400 to 600 Å.

More than one cap layer may be used according to the present invention. For example, a second cap layer may be applied to the present cap layer to provide a dual cap layer structure. The second cap layer may be any conventional cap layer such as organic polysilica cap layer, silicon dioxide, silicon carbide, silicon oxynitride, silicon nitride, silicon oxycarbide, polyarylene ethers, and the like. Alternatively, the present organic polysilica cap layers may be used as the second cap layer of a dual cap layer structure (or the second or third cap layer of a three cap layer structure, etc.) In such application, the present organic polysilica cap layer composition is disposed on a cap layer which is disposed on a dielectric layer. In one embodiment, where two organic polysilica cap layers are used, it is preferred that the first (or cap layer adjacent the dielectric layer) cap layer have a higher silicon carbide content that the second (or upper) cap layer.

To be useful as coating enhancers in the present invention, such compounds, if they remain in the cap layer following final cure, must not interfere with or adversely affect the properties of the cap layer. Preferably, such coating enhancers are at least partially removable under conditions which do not adversely affect the organic polysilica material, preferably substantially removable, and more preferably completely removable. The coating enhancers may be removed prior, during or after complete or final curing of the cap layer material. Preferably, the coating enhancers are removed prior to or during the step of completely curing (final cure) the organic polysilica cap layer material, and more preferably during the final curing step. When the cap layer needs to be dense to fulfill its function, the coating enhancers are typically removed after such function has been fulfilled. By "removable" is meant that the coating enhancer volatilizes, depolymerizes or otherwise breaks down into volatile components or fragments which are then removed from, or migrate out of, the organic polysilica material. Any procedures or conditions which at least partially remove the coating enhancer without substantially degrading the organic polysilica material, that is, where less than 5% by weight of the dielectric material is lost, may be used. It is preferred that the coating enhancer is substantially removed. Suitable methods of removing the coating enhancers are those used for the removal of porogens. Typical methods of removal include, but are not limited to: exposure to heat, vacuum, pressure or radiation such as, but not limited to, actinic, IR, microwave, UV, x-ray, gamma ray, alpha particles, neutron beam or electron beam. It will be appreciated that more than one method of removing the coating enhancer may be used, such as a combination of heat and actinic radiation. It is preferred that the organic polysilica material is exposed to heat or UV light to remove the coating enhancer. It will also be appreciated by those skilled in the art that other methods of coating enhancer removal, such as by atom abstraction, may be employed.

The coating enhancers can be thermally removed under vacuum, nitrogen, argon, mixtures of nitrogen and hydrogen, such as forming gas, or other inert or reducing atmosphere, air as well as under oxidizing atmospheres. The coating enhancers may be removed at any temperature that is higher than the thermal curing temperature and lower than the thermal decomposition temperature of the organic polysilica material. Typically, the polymeric porogen coating enhancers may be removed at temperatures in the range of 150° to 450° C. and preferably in the range of 250° to 425° C. Under preferable thermal removal conditions, the organic polysilica material is heated to a temperature of 350° to 400° C. It will be recognized by those skilled in the art that the particular removal temperature of a coating enhancer will vary according to composition of the coating enhancer. Such heating may be provided by means of an oven or microwave. Typically, the coating enhancers of the present invention are removed upon heating for a period of time in the range of 1 to 120 minutes. After removal from the organic polysilica material, 0 to 20% by weight of the coating enhancer typically remains in the porous organic polysilica material. In another embodiment, when a coating enhancer is removed by exposure to radiation, the coating enhancer is typically exposed under an inert atmosphere, such as nitrogen, to a radiation source, such as, but not limited to, visible or ultraviolet light.

In one embodiment, the coating enhancers are removed from the partially cured cap layer. In this process, the cap layer is heated in a furnace to the desired curing temperature, e.g. 350° to 500° C. and preferably from 400° to 475° C., for a period of time sufficient to complete the organic polysilica curing process. Such times are well known to those skilled in the art. During such final cure step, the coating enhancers may also be removed. In general, when such volatile materials are moved from a fully cured dielectric material, pores or voids remain. Accordingly, porous organic polysilica cap layers are obtained.

The pores in such porous organic polysilica cap layers are substantially the same size as that of the coating enhancer used, particularly when the coating enhancer is a porogen particle. The pore size of the pores in the porous organic polysilica material made by a removable coating enhancer is from 0.5 to 1000 nm, preferably from 0.5 to 200 nm, more preferably from 1 to 50 nm, and still more preferably from 1 to 20 nm.

The present invention provides a structure comprising a first layer of a dielectric material and a cap layer disposed on the dielectric layer, wherein the cap layer is porous. Such cap layer typically has a porosity substantially equal to the amount of porogen used. The cap layer is preferably an organic polysilica cap layer. It is also preferred that the dielectric layer is porous. It is further preferred that the dielectric layer in such structure is an organic polysilica dielectric material. Also provided by this invention is a structure comprising a porous first layer of an organic polysilica dielectric material and a porous cap layer disposed on the dielectric material. Preferably, such cap layer comprises an organic polysilica material.

In general, the porous cap layers of the present invention have a reduced dielectric constant as compared to the same cap layer that is non-porous. Useful organic polysilica cap layers are those having a dielectric constant of $\leq 3$, preferably $\leq 2.9$, more preferably $\leq 2.8$ and still more preferably in the range of 2.5 to 2.8.

The cap layers of the present invention are particularly useful with low dielectric constant ($k \leq 3$) dielectric materials. Structures comprising a dielectric layer having a dielectric constant of $\leq 3$ and an organic polysilica cap layer disposed on the dielectric layer, wherein the organic polysilica cap layer has a dielectric constant of $\leq 2.9$. Such dielectric layers preferably include dielectric materials having a dielectric constant of $\leq 2.8$ and more preferably $\leq 2.5$.

In general, a cap layer has an etch selectivity of 3:1 to 10:1 or greater as compared to the dielectric material it is disposed on. Preferably, the etch selectivity is 5:1 or greater. The particular cap layer B-staged organic polysilica resin is selected to provide such an etch differential with the dielectric layer to which it is applied. When an organic polysilica cap layer is used with an organic polysilica dielectric material such as methyl silsesquioxane, the cap layer organic polysilica is selected so as to have a higher silicon content to provide the requisite etch differential.

The cap layers of the present invention are typically selected such that the difference in etch selectivities between the cap layer and the dielectric layer on which it is disposed is 10% or greater, preferably 20% or greater and more preferably 40% or greater. This is particularly the case when the dielectric layer is a porous organic polysilica material. In a further embodiment, the present invention provides a structure comprising a porous first layer of an organic polysilica dielectric material having a first etch selectivity and a porous cap layer disposed on the dielectric material having a second etch selectivity, wherein the difference in etch selectivities is 10% or greater. Also provided are structures comprising a dielectric layer having a density of $\leq 1$ g/L and a cap layer disposed on the dielectric layer and having a density of $\geq 1$ g/L. Preferably such cap layers are organic polysilica materials. Such organic polysilica cap layers preferably have a density of $\geq 1.1$, and more preferably $\geq 1.2$ g/L.

In a typical process, a dielectric composition, such as a B-staged organic polysilica resin including a porogen (a plurality of polymeric porogen particles), is disposed on a substrate. The B-staged dielectric resin is then at least partially cured at a temperature of up to 250° C. to form the dielectric substrate. A present cap later composition is then disposed, such as by spin coating, on the partially cured organic polysilica dielectric material to provide a two-layer stack or structure. The stack is then set by either partially curing the cap layer or fully curing the materials in the stack at high temperature ($\geq 400°$ C.). The polymeric porogen is removed from the organic polysilica dielectric material during the final curing step. Likewise, the cap layer coating enhancer is removed during the final curing step. Preferably, the porogen used in the B-staged organic polysilica dielectric material is the same as the coating enhancer used in the cap layer composition. Such process has the advantage of a reduced number of steps as compared to fully curing each layer individually, as well as providing improved adhesion between the organic polysilica dielectric material and the cap layer material.

Alternatively, the dielectric material may be fully cured prior to disposing the present cap layer compositions on the dielectric substrate.

The present cap layers are useful in the manufacture of electronic devices, particularly integrated circuits. In such manufacturing process, a low dielectric constant dielectric material is disposed on a substrate; the low dielectric constant dielectric material is then at least partially cured to form a dielectric material layer; a cap layer composition including a B-staged organic polysilica resin and a coating enhancer is disposed on the dielectric material layer, wherein the coating enhancer is present in an amount sufficient to provide a pinhole-free cap layer; the B-staged organic polysilica resin is at least partially curing the to form a cap layer; the coating enhancer is optionally removed; and the cap layer is the optionally completely cured. Such cap layer may then have another cap layer disposed on it, as described above. Alternatively, a pattern may be formed in the cap layer. Such patterning typically involves (i) coating the cap layer with a positive or negative photoresist, such as those marketed by Shipley Company; (ii) imagewise exposing, through a mask, the photoresist to radiation, such as light of appropriate wavelength or e-beam; (iii) developing the image in the resist, e.g., with a suitable developer; and (iv) transferring the image through the cap layer to the substrate with a suitable transfer technique such as reactive ion etching. Such etching creates apertures in the cap layer and the dielectric material. Optionally, an antireflective coating is disposed between the photoresist layer and the cap layer. In the alternative, an antireflective coating may be applied to the surface of the photoresist. Such lithographic patterning techniques are well known to those skilled in the art.

While the above description has been written exemplifying an organic polysilica material as the cap layer material, it will be appreciated by those skilled in the art that the present coating enhancers may be used for other spin-on or liquid applied cap layer materials, such as hydrogen silsesquioxane, spin-on glasses, i.e. silicon dioxide precursors, poly(arylene ethers) and the like.

The following examples are presented to illustrate further various aspects of the present invention, but are not intended to limit the scope of the invention in any aspect.

EXAMPLE 1

Silicon wafers (8 inch or 20 cm diameter) were spin coated with an organic polysilica composition containing 30% solids of methyl silsesquioxane co-condensed with a tetraalkoxyorthosilicate in an organic solvent using a commercially available coating track. The organic polysilica composition contained 22.5% of a compatible porogen by weight. The composition was spin coated on the wafers at 200 rpm and then a film was spread to a thickness of ca. 4000 Å at 3000 rpm. Excess material was removed from the back side of the wafer using a conventional edge bead remover and back side rinse agent. The films were then processed on a hot plate at 90° C. to partially remove the solvent, followed by heating at 230° C. to partially cure the organic polysilica layer.

EXAMPLE 2 (COMPARATIVE)

An organic polysilica cap layer composition containing 3% w/w of a copolymer of methyl silsesquioxane-tetraethylorthosilicate (55:45 molar ratio, with a molecular weight of ca. 6500) in propyleneglycol monomethyl ether acetate with 150 ppm of an acid stabilizer was prepared. The cap layer film has an atom-weight composition of 43% w/w silicon and 10% w/w carbon, which provided an etch selectivity of 5× to 10× as compared to the organic polysilica dielectric layer.

The cap layer composition was deposited on a wafer sample from Example 1 by spin coating (2500 rpm) and had a thickness of ca. 440–550 Å. The sample was then cured in a furnace at 450° C. The surface of the resulting cap layer was analyzed by scanning electron microscopy for the presence of pinhole defects using a KLA-Tencor instrument at 200,000 magnification. FIG. 1 is a SEM of this cap layer which clearly shows the presence of pinhole defects.

EXAMPLE 3

Figure 2:
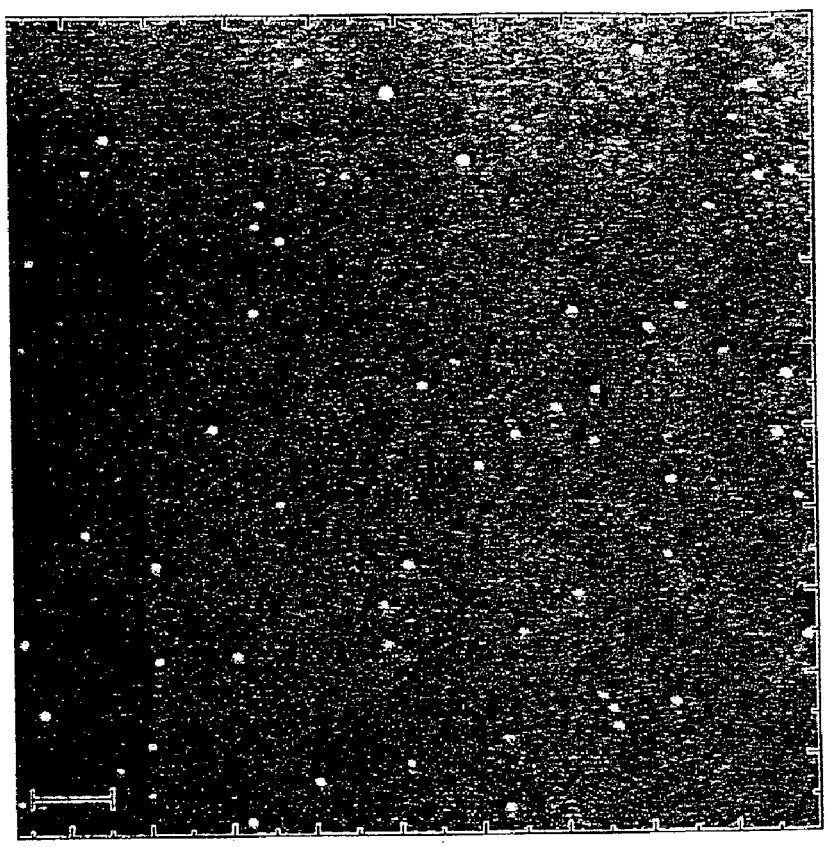
FIG. 2 is a SEM of a spin-coated organic polysilica cap layer prepared from a B-staged organic polysilica resin containing 3% by weight compatibilized porogen and having pinhole defects.

The procedure of Example 2 was repeated except that the cap layer composition further included 3% by weight of a compatibilized polymeric porogen as a coating enhancer. The porogen was a copolymer of PPG260MA/trimethylene glycol dimethacrylate (90/10). "PPG260MA" refers to a polypropyleneglycol ester of methacrylic acid, where the polypropyleneglycol has an average molecular weight of 260. Following furnace curing, the surface of the cap layer was evaluated. FIG. 2 is a SEM of this cap layer which still shows the presence of pinhole defects. The amount of the coating enhancer is insufficient to provide a pinhole defect-free film.

EXAMPLE 4

Figure 3:
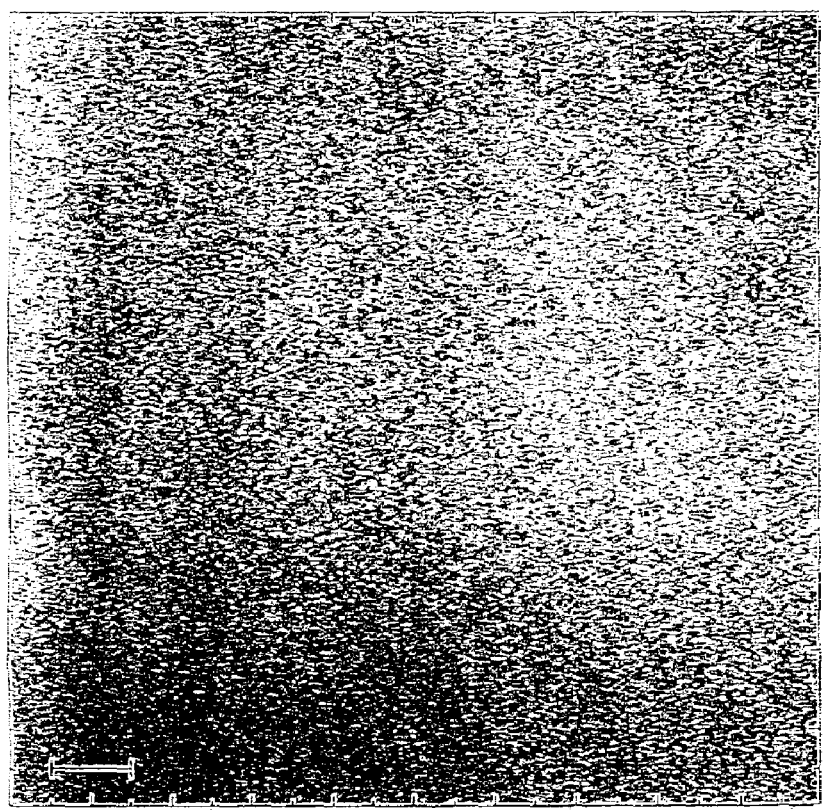
FIG. 3 is a SEM of a spin-coated organic polysilica cap layer prepared from a B-staged organic polysilica resin containing 10% by weight compatibilized porogen and having no pinhole defects.

The procedure of Example 2 was repeated except that 10% by weight of the compatibilized polymeric porogen was used as the coating enhancer. FIG. 3 is a SEM of this cap layer which still shows the surface to be free of pinhole defects.

What is claimed is:

1. A method for depositing an organic polysilica cap layer on a dielectric material comprising the steps of: a) disposing a cap layer composition on a dielectric material, the cap layer composition comprising one or more B-staged organic polysilica resins and one or more coating enhancers; and b) at least partially curing the B-staged organic polysilica resin to form a cap layer; wherein the coating enhancer is present in an amount sufficient to provide a pinhole-free cap layer and wherein the cap layer has an etch selectivity of 3:1 greater as compared to the dielectric material.

2. The method of claim 1 wherein at least one coating enhancer is chosen from high boiling solvents, surfactants, removable polymers and mixtures thereof.

3. The method of claim 2 wherein the removable polymer is a polymeric porogen particle comprising as polymerized units at least one monomer chosen from silyl-containing monomers and poly(alkylene oxide) monomers.

4. The method of claim 3 wherein the removable polymer further comprises as polymerized units one or more cross-linking agents.

5. The method of claim 1 wherein the coating enhancer is present in an amount of >3 to 25 wt %.

6. The method of claim 1 further comprising an organic solvent.

7. The method of claim 1 wherein the cap layer composition further comprises an inorganic compound chosen from silica, alumina, titania, ceria, zirconia and mixtures thereof.

8. The method of claim 1 wherein the dielectric material comprises an organic polysilica material.

9. The method of claim 1 further comprising the step of removing the one or more coating enhancers from the cap layer prior to or during the step of at least partially curing the organic polysilica resin.

10. The method of claim 1 wherein the dielectric material has a dielectric constant of $\leq 3$.

11. A method for manufacturing a device comprising the steps of: a) providing a dielectric material; b) disposing a cap layer composition on the dielectric material, the cap layer composition comprising one or more B-staged organic polysilica resins and one or more removable porogens; and b) at least partially curing the one or more B-staged organic polysilica resin to form a cap layer; wherein the one or more removable porogens are present in an amount sufficient to provide a pinhole-free cap layer, and wherein the can layer has an etch selectivity of 3:1 or greater as compared to the dielectric material.

12. A method for depositing an organic polysilica cap layer on a dielectric material comprising the steps of: a) disposing a cap layer composition on a dielectric material having a dielectric constant of $\leq 3$, the cap layer composition comprising one or more B-staged organic polysilica resins and one or more coating enhancers; and b) at least partially curing the B-staged organic polysilica resin to form a cap layer; wherein the coating enhancer is present in an amount sufficient to provide a pinhole-free cap layer, and wherein the cap layer has an etch selectivity of 3:1 or greater as compared to the dielectric material.

13. The method of claim 12 wherein at least one coating enhancer is chosen from high boiling solvents, surfactants, removable polymers and mixtures thereof.

14. The method of claim 12 wherein the coating enhancer is present in an amount of 1 to 90 wt %.

15. The method of claim 12 further comprising the step of removing the one or more coating enhancers from the cap layer prior to or during the step of at least partially curing the organic polysilica resin.

* * * * *